(12) United States Patent
Chou et al.

(10) Patent No.: US 10,852,878 B2
(45) Date of Patent: Dec. 1, 2020

(54) NON-ORTHOGONAL DEMODULATION MODULE, TOUCH SYSTEM AND NON-ORTHOGONAL DEMODULATION METHOD

(71) Applicant: Shenzhen Goodix Technology Co., Ltd., Shenzhen (CN)

(72) Inventors: Hsin-Jui Chou, Guangdong (CN); Ya-Nan Wen, Guangdong (CN); Yingsi Liang, Guangdong (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 40 days.

(21) Appl. No.: 16/195,786

(22) Filed: Nov. 19, 2018

(65) Prior Publication Data

US 2019/0129569 A1    May 2, 2019

Related U.S. Application Data

(63) Continuation of application No. PCT/CN2017/107757, filed on Oct. 26, 2017.

(51) Int. Cl.
*G06F 3/041* (2006.01)
*H04L 27/22* (2006.01)
(Continued)

(52) U.S. Cl.
CPC ........ *G06F 3/0416* (2013.01); *G06F 3/04166* (2019.05); *H04L 27/22* (2013.01);
(Continued)

(58) Field of Classification Search
CPC combination set(s) only.
See application file for complete search history.

(56) References Cited

U.S. PATENT DOCUMENTS

2010/0059295 A1* 3/2010 Hotelling ............. G09G 5/18
178/18.06
2010/0060590 A1* 3/2010 Wilson ............. G06F 3/0416
345/173
(Continued)

FOREIGN PATENT DOCUMENTS

CN    102576272 A    7/2012
CN    103941940 A    7/2014
(Continued)

*Primary Examiner* — Christopher E Leiby
(74) *Attorney, Agent, or Firm* — Winston Hsu (57) ABSTRACT

The present application provides a non-orthogonal demodulation module, receiving a received signal and the received signal is related to a summation of a plurality of transmitted signals. The plurality of transmitted signals are corresponding to a plurality of frequencies, and the plurality of transmitted signals are not orthogonal to each other. The non-orthogonal demodulation module comprises a mixing-and-integrating unit, configured to perform mixing operations and integrating operations on the received signal respectively at the plurality of frequencies, to generate a plurality of in-phase components and a plurality of quadrature components corresponding to the plurality of frequencies; and a decoding unit, configured to generate at least a decoding matrix, and compute a plurality of energies corresponding to the plurality of transmitted signals according to the at least a decoding matrix, the plurality of in-phase components and the plurality of quadrature components.

18 Claims, 6 Drawing Sheets

(51) Int. Cl.
 *H04L 27/38* (2006.01)
 *H03K 9/00* (2006.01)
 *H04L 27/233* (2006.01)
 *G06F 3/044* (2006.01)
 *H04L 27/14* (2006.01)

(52) U.S. Cl.
 CPC .............. *G06F 3/0446* (2019.05); *H03K 9/00* (2013.01); *H04L 27/14* (2013.01); *H04L 27/233* (2013.01); *H04L 27/38* (2013.01); *H04L 27/3845* (2013.01)

(56) References Cited

U.S. PATENT DOCUMENTS

| | | | |
|---|---|---|---|
| 2015/0029136 A1* | 1/2015 | Shahparnia | G06F 3/044 |
| | | | 345/174 |
| 2015/0205408 A1 | 7/2015 | Tsai | |
| 2015/0309603 A1* | 10/2015 | Kuo | G06F 3/0416 |
| | | | 345/173 |
| 2016/0170516 A1 | 6/2016 | Crandall | |
| 2019/0265857 A1* | 8/2019 | Chou | G06F 3/044 |
| 2019/0384477 A1* | 12/2019 | Wen | G06F 3/044 |

FOREIGN PATENT DOCUMENTS

| | | | |
|---|---|---|---|
| CN | 104793815 A | 7/2015 | |
| CN | 105024964 A | 11/2015 | |
| CN | 106648197 A | 5/2017 | |
| CN | 106708340 A | 5/2017 | |
| CN | 106909254 A | 6/2017 | |
| CN | 107066155 A | 8/2017 | |
| CN | 107219947 A | 9/2017 | |

* cited by examiner

NON-ORTHOGONAL DEMODULATION MODULE, TOUCH SYSTEM AND NON-ORTHOGONAL DEMODULATION METHOD

CROSS REFERENCE TO RELATED APPLICATIONS

The present application is a continuation of international application No. PCT/CN2017/107757, filed on Oct. 26, 2017, of which is incorporated herein by reference in its entirety.

FIELD OF THE INVENTION

The present application relates to a non-orthogonal demodulation module, a touch system and a non-orthogonal demodulation method, and more particularly, to a non-orthogonal demodulation module, a touch system and a non-orthogonal demodulation method reducing signal band.

BACKGROUND

As the technology evolves, the operating interfaces of various electronic products gradually become more user-friendly in recent years. For example, through the touch panel, the user can directly operate on the screen with a finger or a stylus to input a message/text/pattern, which spares the trouble of using an input device such as a keyboard or a button. In fact, the touch panel usually includes a sensing panel and a monitor disposed behind the sensing panel. The electronic device determines the meaning of the touch events according to the location of the touch made by the user on the sensing panel and the content displayed by the monitor, and performs the corresponding operations.

Figure 6:
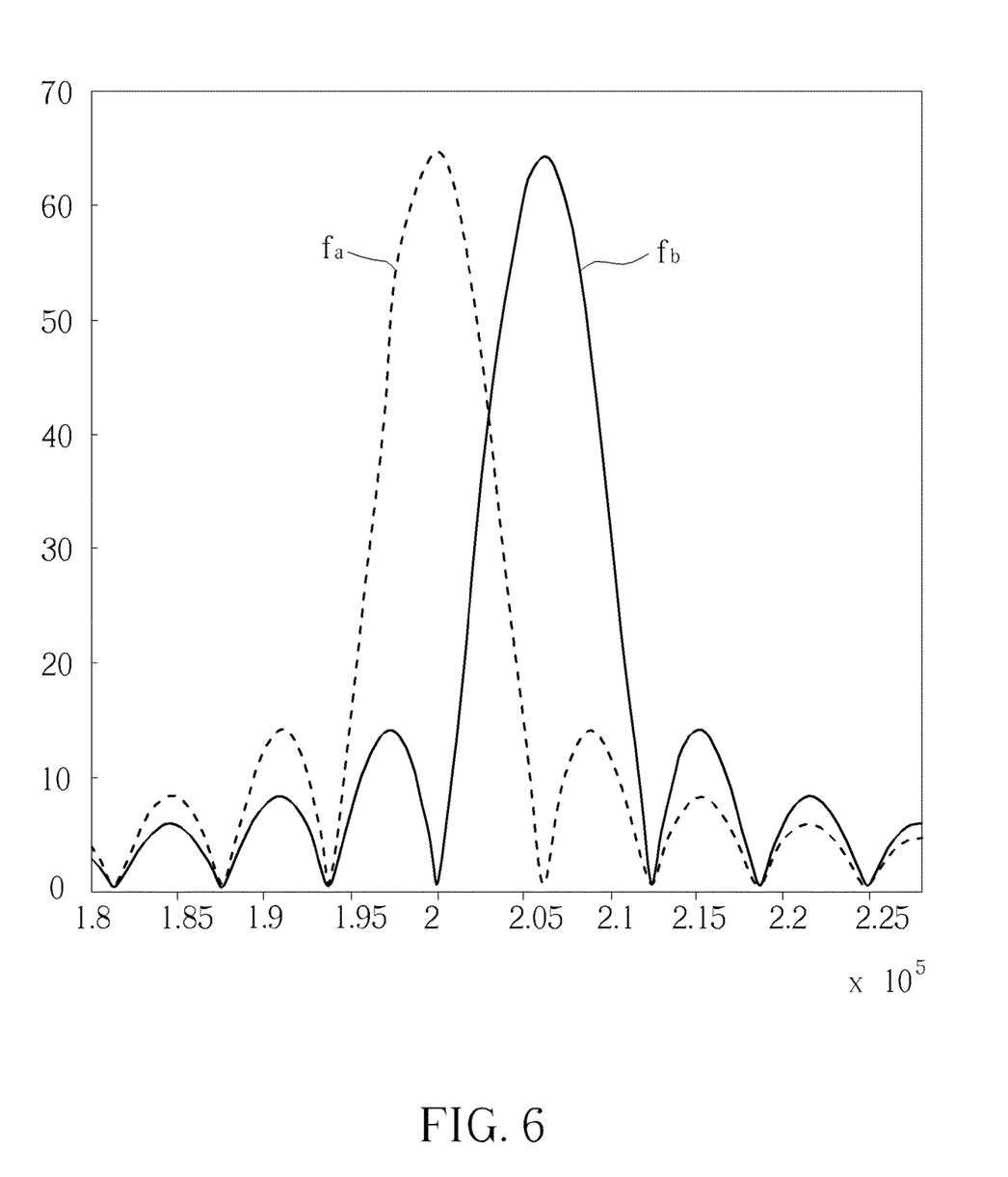
FIG. 6 illustrates spectrums of two signals orthogonal to each other.

The touch technology in the prior art has developed a method of transmitting signals, which have different frequencies and are mutually orthogonal, by two transmitting electrodes of the touch system at the same time (i.e., transmitting two signals to two electrodes). Since the transmitted signals are mutually orthogonal, signals at different frequencies can be differentiated in the demodulation process. FIG. 6 illustrates signal spectrums of two orthogonal signals, and frequencies of which are $f_a$ and $f_b$. To maintain the orthogonality, the frequencies of the two orthogonal signals have to be separated by a specific frequency gap. However, if two or more orthogonal signals are transmitted, the bandwidth occupied by the signals (a.k.a., signal band) would be large, and no interference with the signal band has to be guaranteed, which complicates design of the touch system.

Therefore, how to reduce the signal band when multiple signals is transmitted to multiple electrodes is a significant objective in the field.

SUMMARY

It is therefore an objective of an embodiment of the present application to provide a non-orthogonal demodulation module, a touch system and a non-orthogonal demodulation method reducing the signal band, to improve over disadvantages of the prior art.

To solve the technical problem stated in the above, an embodiment of the present application provides a non-orthogonal demodulation module to perform demodulation on a received signal.

The received signal is related to a summation of a plurality of transmitted signals, the plurality of transmitted signals are corresponding to a plurality of frequencies, and the plurality of transmitted signals are not orthogonal to each other, the non-orthogonal demodulation module comprising a mixing-and-integrating unit, configured to perform mixing operations and integrating operations on the received signal respectively at the plurality of frequencies, to generate a plurality of in-phase components and a plurality of quadrature components corresponding to the plurality of frequencies; and a decoding unit, configured to generate at least a decoding matrix, and compute a plurality of energies corresponding to the plurality of transmitted signals according to the at least a decoding matrix, the plurality of in-phase components and the plurality of quadrature components.

For example, the decoding unit is configured to perform the following steps: arranging the plurality of in-phase components as an in-phase vector, and arranging the plurality of quadrature components as a quadrature vector; obtaining at least a matrix, wherein the at least a matrix comprises a plurality of off-diagonal entries, the plurality of off-diagonal entries is related to the at least a frequency difference, and the at least a frequency difference is a frequency difference between two frequencies within the plurality of frequencies; computing the at least a decoding matrix, wherein the at least a decoding matrix is proportional to in inverse matrix of the at least a matrix; obtaining an in-phase result and a quadrature result according to the at least a decoding matrix, the in-phase vector and the quadrature vector; and computing the plurality of energies corresponding to the plurality of transmitted signals according to the in-phase result and the quadrature result.

For example, the plurality of off-diagonal entries is related to the at least a frequency difference and at least a frequency sum, and the at least a frequency sum is a frequency sum of two frequencies within the plurality of frequencies.

For example, the mixing-and-integrating unit applies a window function on the received signal, the window function corresponds to a window spectrum, the plurality of off-diagonal entries is related to at least a difference spectrum value, and the at least a difference spectrum value is a spectrum value of the window spectrum corresponding to the at least a frequency difference.

For example, the plurality of off-diagonal entries is related to the at least a difference spectrum value and at least a sum spectrum value, the at least a sum spectrum value is a spectrum value of the window spectrum corresponding to at least a frequency sum, and the at least a frequency sum is a frequency sum of two frequencies within the plurality of frequencies.

To solve the technical problem stated in the above, an embodiment of the present application provides a touch system, comprising a plurality of transmitting electrodes; a plurality of receiving electrodes; a signal generating module, coupled to the plurality of transmitting electrodes, wherein in a first time, the signal generating module transmits the plurality of transmitted signals respectively to the plurality of transmitting electrodes, the plurality of transmitted signals are corresponding to a plurality of frequencies, and the plurality of transmitted signals are not orthogonal to each other; and a non-orthogonal demodulation module, coupled to the plurality of transmitting electrodes, wherein in the first time, the non-orthogonal demodulation module receives a received signal on a first receiving electrode within the plurality of receiving electrodes, the non-orthogonal demodulation module comprising a mixing-and-integrating unit, configured to perform mixing operations and integrating operations on the received signal respectively at the plurality of frequencies, to generate a plurality of in-phase components and a plurality of quadrature components corresponding to the plurality of frequencies; and a decoding unit, configured to generate at least a decoding matrix, and computing a plurality of energies corresponding to the plurality of transmitted signals according to the at least a decoding matrix, the plurality of in-phase components and the plurality of quadrature components.

For example, the signal generating module transmits a first transmitted signal to a first transmitting electrode within the plurality of transmitting electrodes in a calibration time, the non-orthogonal demodulation module receives a calibration signal through the first receiving electrode, the mixing-and-integrating unit generates a plurality of calibration in-phase components and a plurality of calibration quadrature components corresponding to the plurality of frequencies according to the calibration signal, the decoding unit generates the at least a matrix according to the plurality of calibration in-phase components or the plurality of calibration quadrature components, and the first transmitted signal is corresponding to a first frequency within the plurality of frequencies.

For example, an off-diagonal entry within the plurality of off-diagonal entries is a ratio of a first calibration in-phase component and a second calibration in-phase component within the plurality of calibration in-phase components, and the first calibration in-phase component is corresponding to the first frequency.

For example, an off-diagonal entry within the plurality of off-diagonal entries is a ratio of a first calibration quadrature component and a second calibration quadrature component within the plurality of calibration quadrature components, and the first calibration quadrature component is corresponding to the first frequency.

For example, the first frequency times a time interval is an integer, and the time interval is a window function interval of the window function or an integration interval of the integrating operation.

To solve the technical problem stated in the above, an embodiment of the present application provides a non-orthogonal demodulation method, applied in a touch system. The touch system comprises a plurality of transmitting electrodes and a plurality of receiving electrodes. The non-orthogonal demodulation method comprises transmitting the plurality of transmitted signals respectively to the plurality of transmitting electrodes in a first time, wherein the plurality of transmitted signals are corresponding to a plurality of frequencies, and the plurality of transmitted signals are not orthogonal to each other; receiving a received signal from a first receiving electrode within the plurality of receiving electrodes in the first time; performing mixing operations and integrating operations on the received signal respectively at the plurality of frequencies, to generate a plurality of in-phase components and a plurality of quadrature components corresponding to the plurality of frequencies; and generating at least a decoding matrix, and computing a plurality of energies corresponding to the plurality of transmitted signals according to the at least a decoding matrix, the plurality of in-phase components and the plurality of quadrature components.

The embodiments of the present application utilizes the decoding matrices to perform demodulation on the non-orthogonal transmitted signals, to compute the energies corresponding to the plurality of transmitted signals and to determine the coordinate of the touch event. Compared to the prior art, the present application has advantages of having smaller signal band.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
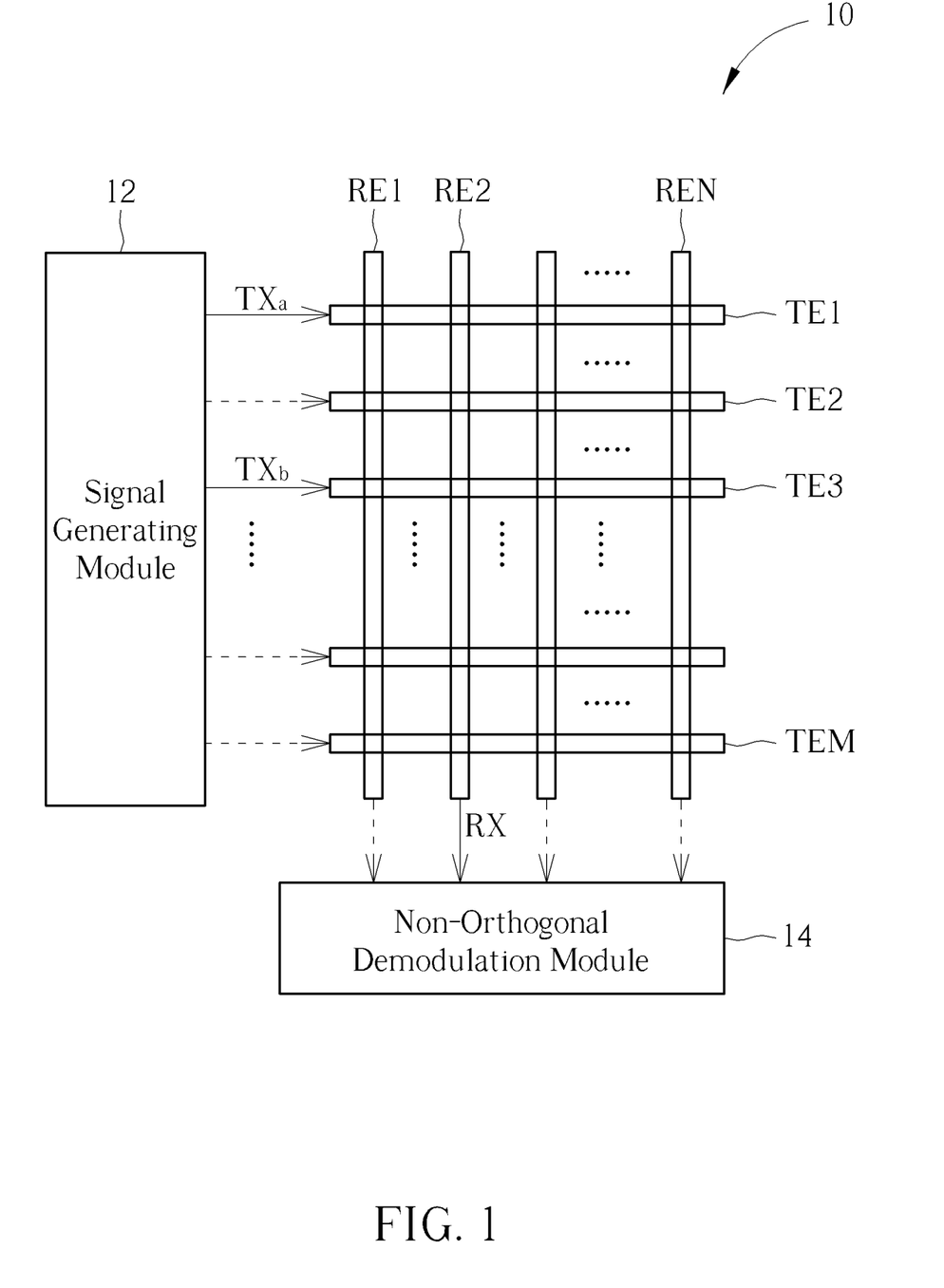
FIG. 1 is a schematic diagram of a touch system according to an embodiment of the present application.

Please refer to FIG. 1. FIG. 1 is a schematic diagram of a touch system 10 according to an embodiment of the present application. The touch system 10 comprises transmitting electrodes TE1-TEM, receiving electrodes RE1-REN, a signal generating module 12 and a non-orthogonal demodulation module 14. The signal generating module 12 is coupled to the transmitting electrodes TE1-TEM. The signal generating module 12 may transmit the plurality of transmitted signals respectively to a part or all of the transmitting electrodes TE1-TEM at the same time. The non-orthogonal demodulation module 14 is coupled to the transmitting electrodes TE1-TEM. The non-orthogonal demodulation module 14 may receive one received signal on one receiving electrode at one time, and perform non-orthogonal demodulation on the received signal, to obtain amplitudes/energies corresponding to the plurality of transmitted signals on the receiving electrode, so as to determine a coordinate of a touch event. Since obtaining the amplitudes of the plurality of transmitted signals is equivalent to obtaining the energies of the plurality of transmitted signals, since obtaining the energies would lead to obtaining the amplitudes, and vice versa. In the following description and claims, it would illustratively be based on obtaining the energies of the plurality of transmitted signals.

In addition, in order to reduce the spectrum band of the plurality of transmitted signals (i.e., reduce the signal band), the plurality of transmitted signals may not be mutually orthogonal to each other. The plurality of transmitted signals may be a plurality of single-tone signals, where the plurality of single-tone signals are corresponding to a plurality of frequencies. For example, by ignoring the phases therein, the transmitted signal $TX_m$ may be proportional to $\sin 2\pi f_m t$ or cos $2\pi f_m t$, i.e., the transmitted signal $TX_m$ is corresponding to the frequency $f_m$. Supposed that the plurality of transmitted signals are all single-tone signals, if a difference between the frequencies $f_m$, $f_n$ of two single-tone transmitted signals $TX_m$, $TX_n$ is equal to a multiple of a reciprocal of a time interval T (i.e., $|f_m-f_n|=K/T$, where K is a positive integer), the single-tone transmitted signals $TX_m$, $TX_n$ are orthogonal to each other. On the contrary, if the difference between the frequencies $f_m$, $f_n$ is less than 1/T (or not equal to K/T), the single-tone transmitted signals $TX_m$, $TX_n$ are not orthogonal to each other. Moreover, the time interval T may be a window function interval or an integration interval, which will be described later on.

For illustrative purpose, the following description would be based on an illustrative scenario of "the signal generating module 12 transmitting two single-tone transmitted signals $TX_a$, $TX_b$ to two transmitting electrodes TE1, TE3 at the same time (i.e., the first time) and the non-orthogonal demodulation module 14 receiving the received signal RX on the receiving electrode RE2", but not limited thereto. Supposed that the two single-tone transmitted signals are $TX_a=\sin 2\pi f_a t$ and $TX_b=\sin 2\pi f_b t$, the received signal RX may be expressed as $RX=A \sin(2\pi f_a t+\theta_a)+B \sin(2\pi f_b t+\theta_b)$. $\theta_a$, $\theta_b$ are phases corresponding to the transmitted signals $TX_a$, $TX_b$ received at the receiving electrode RE2, respectively. A, B are amplitudes corresponding to the transmitted signals $TX_a$, $TX_b$ received at the receiving electrode RE2, respectively. $A^2$, $B^2$ are energies corresponding to the transmitted signals $TX_a$, $TX_b$ received at the receiving electrode RE2, respectively. The non-orthogonal demodulation module 14 may derive the energies $A^2$, $B^2$ corresponding to the transmitted signals $TX_a$, $TX_b$ according to the received signal RX.

Figure 2:
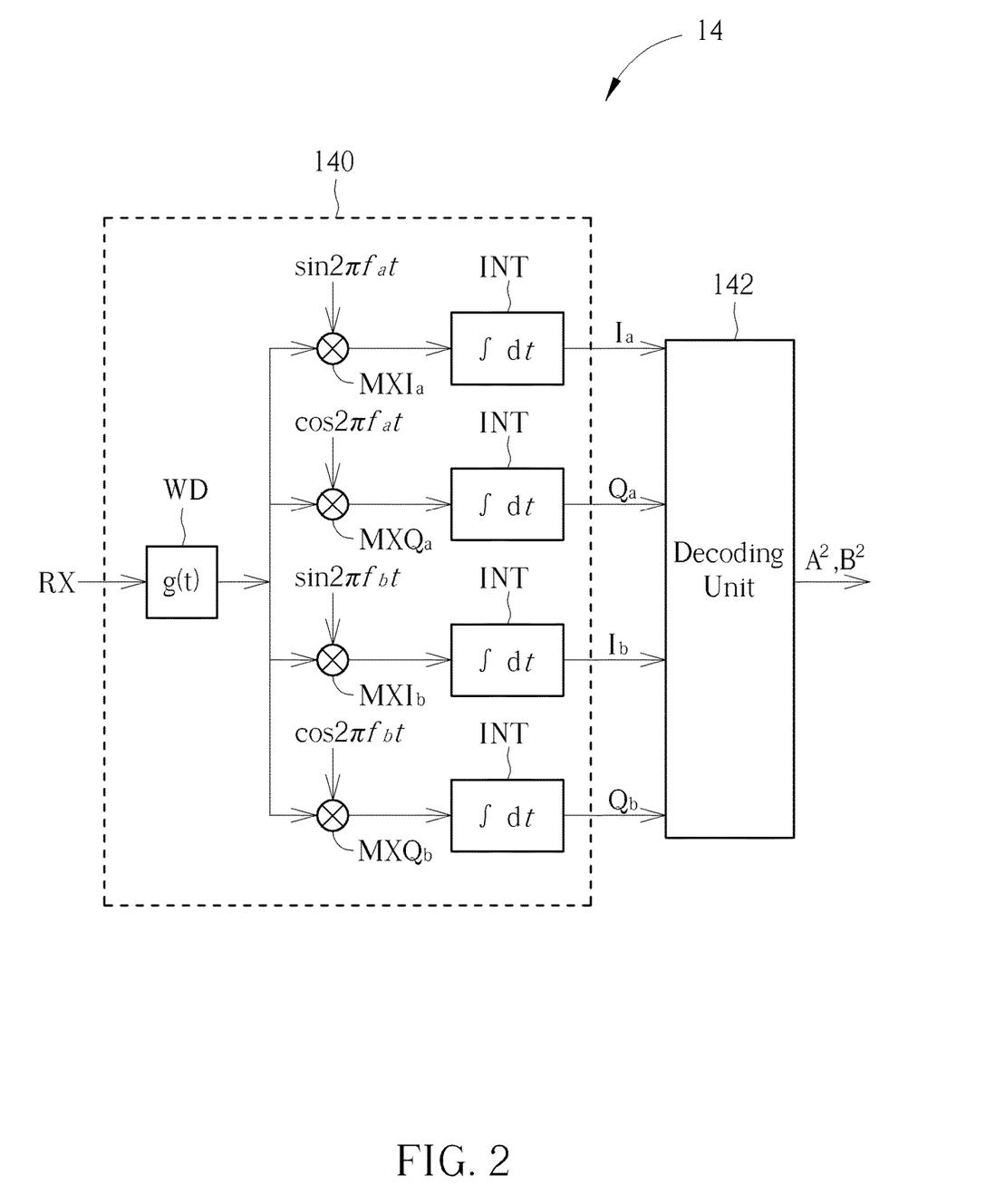
FIG. 2 is a schematic diagram of a non-orthogonal demodulation module according to an embodiment of the present application.

Specifically, please refer to FIG. 2. FIG. 2 is a schematic diagram of the non-orthogonal demodulation module 14 according to an embodiment of the present application. The non-orthogonal demodulation module 14 comprises a mixing-and-integrating unit 140 and a decoding unit 142. The mixing-and-integrating unit 140 is configured to perform the mixing operations and the integrating operations on the received signal RX at the frequencies $f_a$, $f_b$, to generate in-phase components $I_a$, $I_b$ and quadrature components $Q_a$, $Q_b$ corresponding to the frequencies $f_a$, $f_b$. The decoding unit 142 may generate decoding matrices $D_I$ and $D_Q$ corresponding to an I-channel and a Q-channel, and compute the energies $A^2$, $B^2$ corresponding to the transmitted signals $TX_a$, $TX_b$ according to the decoding matrices $D_I$, $D_Q$, the in-phase components $I_a$, $I_b$ and the quadrature components $Q_a$, $Q_b$. The decoding unit 142 may be realized by digital circuit or DSP (Digital Signal Processor).

The circuit structure of the mixing-and-integrating unit 140 is known by people skilled in the art, which is briefed in the following. The mixing-and-integrating unit 140 comprises mixers $MXI_a$, $MXQ_a$, $MXI_b$, $MXQ_b$, a window function unit WD and an integrator INT. The window function unit WD is equivalent to applying a window function g(t) on the received signal RX in a continuous time domain. The mixers $MXI_a$, $MXQ_a$, $MXI_b$, $MXQ_b$ multiply the output of the window function unit WD by $\sin 2\pi f_a t$, $\cos 2\pi f_a t$, $\sin 2\pi f_b t$, $\cos 2\pi f_b t$, respectively. Finally, the integrator INT performs integration on the outputs of the mixers $MXI_a$, $MXQ_a$, $MXI_b$, $MXQ_b$, and outputs the in-phase components $I_a$, $I_b$ and the quadrature components $Q_a$, $Q_b$.

Figure 3:
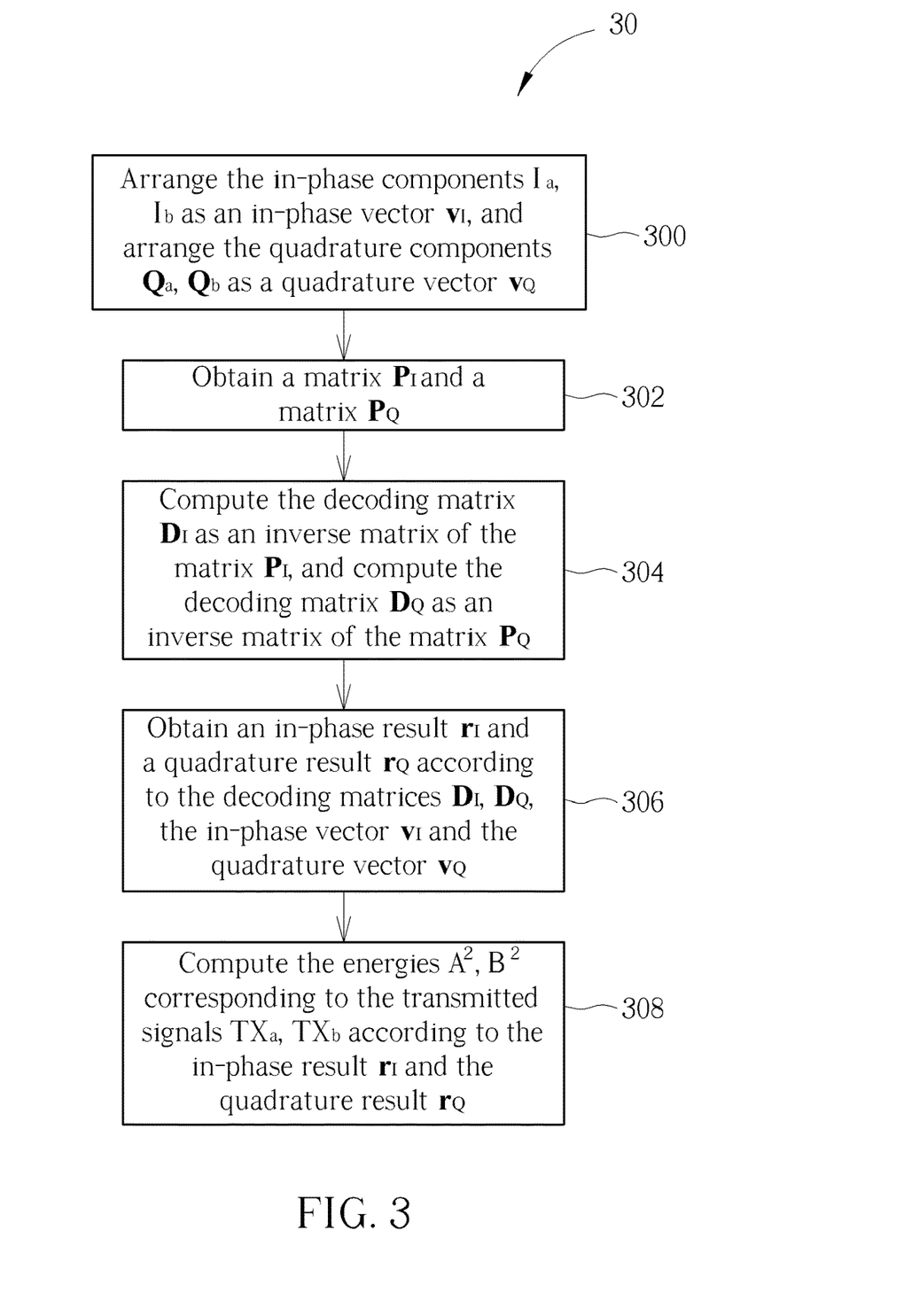
FIG. 3 is a schematic diagram of a decoding process according to an embodiment of the present application.

Please refer to FIG. 3. FIG. 3 is a schematic diagram of a decoding process 30 according to an embodiment of the present application. The decoding unit 142 performs the decoding process 30 to compute the energies $A^2$, $B^2$ corresponding to the transmitted signals $TX_a$, $TX_b$. The decoding process 30 comprises the following steps:

Step 300: Arrange the in-phase components $I_a$, $I_b$ as an in-phase vector $v_I$, and arrange the quadrature components $Q_a$, $Q_b$ as a quadrature vector $v_Q$.

Step 302: Obtain a matrix $P_I$ and a matrix $P_Q$.

Step 304: Compute the decoding matrix $D_I$ as an inverse matrix of the matrix $P_I$, and compute the decoding matrix $D_Q$ as an inverse matrix of the matrix $P_Q$.

Step 306: Obtain an in-phase result $r_I$ and a quadrature result $r_Q$ according to the decoding matrices $D_I$, $D_Q$, the in-phase vector $v_I$ and the quadrature vector $v_Q$.

Step 308: Compute the energies $A^2$, $B^2$ corresponding to the transmitted signals $TX_a$, $TX_b$ according to the in-phase result $r_I$ and the quadrature result $r_Q$.

In Step 300, the decoding unit 142 may form the in-phase vector $v_I$ as $v_I=[I_a, I_b]^T$, and form the quadrature vector $v_Q$ as $v_Q=[Q_a, Q_b]^T$.

Principles of Step 302 to Step 308 are described as the following. In general, since the operations performed by the mixing-and-integrating unit 140 on the received signal RX are linear operations, the amplitudes A, B and the in-phase components $I_a$, $I_b$ and the quadrature components $Q_a$, $Q_b$ outputted by the mixing-and-integrating unit 140 have linear relationship. In vector/matrix form, the in-phase vector $v_I$ may be expressed as $v_I=P_I r_I$, the quadrature vector $v_Q$ may be expressed as $v_Q=P_Q r_Q$, where $r_I=[r_{I,a}, r_{I,b}]^T$ and $r_Q=[r_{Q,a}, r_{Q,b}]^T$. The amplitude A has a linear relationship versus $r_{I,a}$, $r_{Q,a}$; the amplitude B has a linear relationship versus $r_{I,b}$, $r_{Q,b}$. The matrices $P_I$ and $P_Q$ are configured to describe the linear relationships between the in-phase components ($I_a$, $I_b$), the quadrature components ($Q_a$, $Q_b$) and $r_{I,a}$, $r_{Q,a}$. That is, the matrix $P_I$ is configured to described the linear relationship of the in-phase vector $v_I$ versus $r_I$; the matrix $P_Q$ is configured to described the linear relationship of the quadrature vector $v_Q$ versus $r_Q$.

In Step 302, the decoding unit 142 obtains the matrix $P_I$ and the matrix $P_Q$ first. In Step 304, the decoding unit 142 computes the decoding matrix $D_I$ to be proportional to the inverse matrix of the matrix $P_I$ (i.e., $D_I=c (P_I)^{-1}$) and computes the decoding matrix $D_Q$ to be proportional to the inverse matrix of the matrix $P_Q$ (i.e., $D_Q=c (P_Q)^{-1}$), where c is a constant. For brevity, the constant c is assumed to be 1 (c=1), but the constant c is not limited thereto in reality. In Step 306, the decoding unit 142 may multiply the decoding matrix $D_I$ with the in-phase vector $v_I$ to obtain the in-phase result $r_I$ (i.e., $D_I v_I=r_I$), and multiply the decoding matrix $D_Q$ with the quadrature vector $v_Q$ to obtain the quadrature result $r_Q$ (i.e., $D_Q v_Q=r_Q$). Therefore, in Step 308, the decoding unit 142 may compute the energies $A^2$, $B^2$ corresponding to the transmitted signals $TX_a$, $TX_b$ according to the in-phase result $r_I$ and the quadrature result $r_Q$.

In detail, the in-phase components $I_a$, $I_b$ and the quadrature components $Q_a$, $Q_b$ may be expressed as eq. 1.1-1.4 (in the below). It is assumed that the window function g(t) is 0 when t is less than $(-T/2)$ or greater than $T/2$, i.e., $g(t)=0$, $\forall t \notin [-T/2, T/2]$, where the time interval T may be a window function interval corresponding to the window function g(t) or an integration interval of the integrator. The window function g(t) is corresponding to a window spectrum G(f), and the window spectrum G(f) is Fourier transform of the window function g(t), i.e., $G(f)=\int g(t)e^{-2\pi f t}dt$. In addition, a frequency sum $f_{a+b}$ represents a sum of the frequencies $f_a$, $f_b$, which may be expressed as $f_{a+b}=f_a+f_b$; a frequency difference $f_{a-b}$ represents a difference between the frequencies $f_a$, $f_b$, which may be expressed as $f_{a-b}=f_a-f_b$. A sum spectrum value $G(f_{a+b})$ and a difference spectrum value $G(f_{a-b})$ represent spectrum values of the window spectrum G(f) at the frequency sum $f_{a+b}$ and the frequency difference $f_{a-b}$, respectively, and $G(2f_a)$ and $G(2f_b)$ represent spectrum values of the window spectrum G(f) at a double frequency $2f_a$ and a double frequency $2f_b$.

$$I_a = \int_{-T/2}^{T/2} (A\sin(2\pi f_a t + \theta_a) + \qquad \text{(eq. 1.1)}$$
$$B\sin(2\pi f_b t + \theta_b))\sin(2\pi f_a t)g(t)dt$$
$$= \left(\frac{-A}{2}G(2f_a) + \frac{AT}{2}\right)\cos\theta_a +$$
$$\left(\frac{-B}{2}G(f_{a+b}) + \frac{B}{2}G(f_{a-b})\right)\cos\theta_b$$

$$I_b = \int_{-T/2}^{T/2} (A\sin(2\pi f_a t + \theta_a) + \qquad \text{(eq. 1.2)}$$
$$B\sin(2\pi f_b t + \theta_b))\sin(2\pi f_b t)g(t)dt$$
$$= \left(\frac{-A}{2}G(f_{a+b}) + \frac{A}{2}G(f_{a-b})\right)\cos\theta_a +$$
$$\left(\frac{-B}{2}G(f_b) + \frac{BT}{2}\right)\cos\theta_b$$

$$Q_a = \int_{-T/2}^{T/2} (A\sin(2\pi f_a t + \theta_a) + \qquad \text{(eq. 1.3)}$$
$$B\sin(2\pi f_b t + \theta_b))\cos(2\pi f_a t)g(t)dt$$
$$= \left(\frac{A}{2}G(2f_a) + \frac{AT}{2}\right)\sin\theta_a +$$
$$\left(\frac{B}{2}G(f_{a+b}) + \frac{B}{2}G(f_{a-b})\right)\sin\theta_b$$

$$Q_b = \int_{-T/2}^{T/2} (A\sin(2\pi f_a t + \theta_a) + \qquad \text{(eq. 1.4)}$$
$$B\sin(2\pi f_b t + \theta_b))\cos(2\pi f_b t)g(t)dt$$
$$= \left(\frac{A}{2}G(f_{a+b}) + \frac{A}{2}G(f_{a-b})\right)\sin\theta_a +$$
$$\left(\frac{B}{2}G(f_b) + \frac{BT}{2}\right)\sin\theta_b$$

Ignoring the double frequency spectrum values $G(2f_a)$, $G(2f_b)$, the in-phase components $I_a$, $I_b$ and the quadrature components $Q_a$, $Q_b$ may be expressed as eq. 2.1-2.4.

$$I_a = \left(\frac{AT}{2}\right)\cos\theta_a + \left(\frac{-B}{2}G(f_{a+b}) + \frac{B}{2}G(f_{a-b})\right)\cos\theta_b \qquad \text{(eq. 2.1)}$$

$$I_b = \left(\frac{-A}{2}G(f_{a+b}) + \frac{A}{2}G(f_{a-b})\right)\cos\theta_a + \left(\frac{BT}{2}\right)\cos\theta_b \qquad \text{(eq. 2.2)}$$

$$Q_a = \left(\frac{AT}{2}\right)\sin\theta_a + \left(\frac{B}{2}G(f_{a+b}) + \frac{B}{2}G(f_{a-b})\right)\sin\theta_b \qquad \text{(eq. 2.3)}$$

$$Q_b = \left(\frac{A}{2}G(f_{a+b}) + \frac{A}{2}G(f_{a-b})\right)\sin\theta_a + \left(\frac{BT}{2}\right)\sin\theta_b \qquad \text{(eq. 2.4)}$$

In other words, the in-phase vector $v_I$ and the quadrature vector $v_Q$ may be expressed in matrix form as eq. 3.1 and 3.2.

$$v_I = \begin{bmatrix} I_a \\ I_b \end{bmatrix} = \begin{bmatrix} 1 & (G(f_{a-b}) - G(f_{a+b}))/T \\ (G(f_{a-b}) - G(f_{a+b}))/T & 1 \end{bmatrix} \qquad \text{(eq. 3.1)}$$
$$\begin{bmatrix} (AT/2)\cos\theta_a \\ (BT/2)\cos\theta_b \end{bmatrix} = P_I r_I$$

$$v_Q = \begin{bmatrix} Q_a \\ Q_b \end{bmatrix} = \begin{bmatrix} 1 & (G(f_{a-b}) + G(f_{a+b}))/T \\ (G(f_{a-b}) + G(f_{a+b}))/T & 1 \end{bmatrix} \qquad \text{(eq. 3.2)}$$
$$\begin{bmatrix} (AT/2)\sin\theta_a \\ (BT/2)\sin\theta_b \end{bmatrix} = P_Q r_Q$$

In an embodiment, in Step 302, the decoding unit 142 may obtain the matrix $P_I$ as eq. 4.1, and may obtain the matrix $P_Q$ as eq. 4.2. In Step 304, the decoding unit 142 may compute $D_I = (P_I)^{-1}$ and $D_Q = (P_Q)^{-1}$. As can be seen from eq. 4.1 and 4.2, the off-diagonal entries of the matrices $P_I$, $P_Q$ are related to the difference spectrum value $G(f_{a-b})$ and the sum spectrum value $G(f_{a+b})$, which means that, the off-diagonal entries of the matrices $P_I$, $P_Q$ are related to the frequency difference $f_{a-b}$ and the frequency sum $f_{a+b}$.

$$P_I = \begin{bmatrix} 1 & (G(f_{a-b}) - G(f_{a+b}))/T \\ (G(f_{a-b}) - G(f_{a+b}))/T & 1 \end{bmatrix} \qquad \text{(eq. 4.1)}$$

$$P_Q = \begin{bmatrix} 1 & (G(f_{a-b}) + G(f_{a+b}))/T \\ (G(f_{a-b}) + G(f_{a+b}))/T & 1 \end{bmatrix} \qquad \text{(eq. 4.2)}$$

Therefore, in Step 306, the decoding unit 142 may compute the in-phase result $r_I$ as eq. 5.1, and compute the quadrature result $r_Q$ as eq. 5.2.

$$r_I = \begin{bmatrix} r_{I,a} \\ r_{I,b} \end{bmatrix} = \qquad \text{(eq. 5.1)}$$
$$\begin{bmatrix} 1 & (G(f_{a-b}) - G(f_{a+b}))/T \\ (G(f_{a-b}) - G(f_{a+b}))/T & 1 \end{bmatrix}^{-1} \begin{bmatrix} I_a \\ I_b \end{bmatrix}$$

$$r_Q = \begin{bmatrix} r_{Q,a} \\ r_{Q,b} \end{bmatrix} = \qquad \text{(eq. 5.2)}$$
$$\begin{bmatrix} 1 & (G(f_{a-b}) + G(f_{a+b}))/T \\ (G(f_{a-b}) + G(f_{a+b}))/T & 1 \end{bmatrix}^{-1} \begin{bmatrix} Q_a \\ Q_b \end{bmatrix}$$

According to eq. 3.1, 3.2, $r_{I,a}$ and $r_{I,b}$ within the in-phase result $r_I$ are expressed as $r_{I,a} = (AT/2)\cos\theta_a$ and $r_{I,b} = (BT/2)\cos\theta_b$, and $r_{Q,a}$ and $r_{Q,b}$ within the quadrature result $r_Q$ are expressed as $r_{Q,a} = (AT/2)\sin\theta_a$ and $r_{Q,b} = (BT/2)\sin\theta_b$. Therefore, in Step 308, the decoding unit 142 may obtain $(AT/2)^2 = (r_{I,a})^2 + (r_{Q,a})^2$ and $(BT/2)^2 = (r_{I,b})^2 + (r_{Q,b})^2$. In addition, the time interval T is known to the decoding unit 142, such that the decoding unit 142 may compute the energies $A^2$, $B^2$ corresponding to the transmitted signals $TX_a$, $TX_b$ according to the in-phase result $r_I$ and the quadrature result $r_Q$.

The embodiment stated in the above illustrates obtaining the matrices $P_I$, $P_Q$ under the condition of ignoring the double frequency spectrum values $G(2f_a)$, $G(2f_b)$. In another embodiment, the sum spectrum value $G(f_{a+b})$ may be further neglected. That is, the decoding unit 142 may obtain the matrices $P_I$, $P_Q$ as eq. 6 in Step 302, and compute the energies $A^2$, $B^2$ corresponding to the transmitted signals $TX_a$, $TX_b$ according to the details of Steps 304-308.

$$P_I = P_Q = \begin{bmatrix} 1 & G(f_{a-b})/T \\ G(f_{a-b})/T & 1 \end{bmatrix} = P \quad \text{(eq. 6)}$$

Notably, under the case of ignoring the double frequency spectrum values $G(2f_a)$, $G(2f_b)$ and the sum spectrum value $G(f_{a+b})$, it is sufficient for the decoding unit 142, which only needs one single matrix P in Step 302, to execute the following Steps 304-308, and the off-diagonal entries of the matrix P are related to the difference spectrum value $G(f_{a-b})$. That is, the off-diagonal entries of the matrix P are related to the frequency difference $f_{a-b}$.

For example, the window function g(t) may be a rectangular window. That is, the window function g(t) may be expressed as g(t)=rect(t/T), i.e., g(t)=1, $\forall t \in [-T/2, T/2]$, which means that the window function unit WD does not suppress sidelobe of its output signal but only constraint an integration interval of the integrator INT. In this case, the matrices $P_I$, $P_Q$ may be expressed as eq. 7.1-7.2 (by ignoring the double frequency spectrum values), eq. 8 (by ignoring the double frequency spectrum values and the sum spectrum value) or eq. 9.1-9.2 (holding the double frequency spectrum values and the sum spectrum value), with $\text{sinc}(x) = \sin(\pi x)/(\pi x)$.

$$P_I = \begin{bmatrix} 1 & \sin c(Tf_{a-b}) - \sin c(Tf_{a+b}) \\ \sin c(Tf_{a-b}) - \sin c(Tf_{a+b}) & 1 \end{bmatrix} \quad \text{(eq. 7.1)}$$

$$P_Q = \begin{bmatrix} 1 & \sin c(Tf_{a-b}) + \sin c(Tf_{a+b}) \\ \sin c(Tf_{a-b}) + \sin c(Tf_{a+b}) & 1 \end{bmatrix} \quad \text{(eq. 7.2)}$$

$$P_I = P_Q = \begin{bmatrix} 1 & \sin c(Tf_{a-b}) \\ \sin c(Tf_{a-b}) & 1 \end{bmatrix} = P \quad \text{(eq. 8)}$$

$$P_I = \begin{bmatrix} 1 - \sin c(tf_{a+b}) & \sin c(Tf_{a-b}) - \sin c(Tf_{a+b}) \\ \sin c(Tf_{a-b}) - \sin c(Tf_{a+b}) & 1 - \sin c(Tf_{a+b}) \end{bmatrix} \quad \text{(eq. 9.1)}$$

$$P_Q = \begin{bmatrix} 1 + \sin c(Tf_{a+b}) & \sin c(Tf_{a-b}) + \sin c(Tf_{a+b}) \\ \sin c(Tf_{a-b}) + \sin c(Tf_{a+b}) & 1 + \sin c(Tf_{a+b}) \end{bmatrix} \quad \text{(eq. 9.2)}$$

Figure 4:
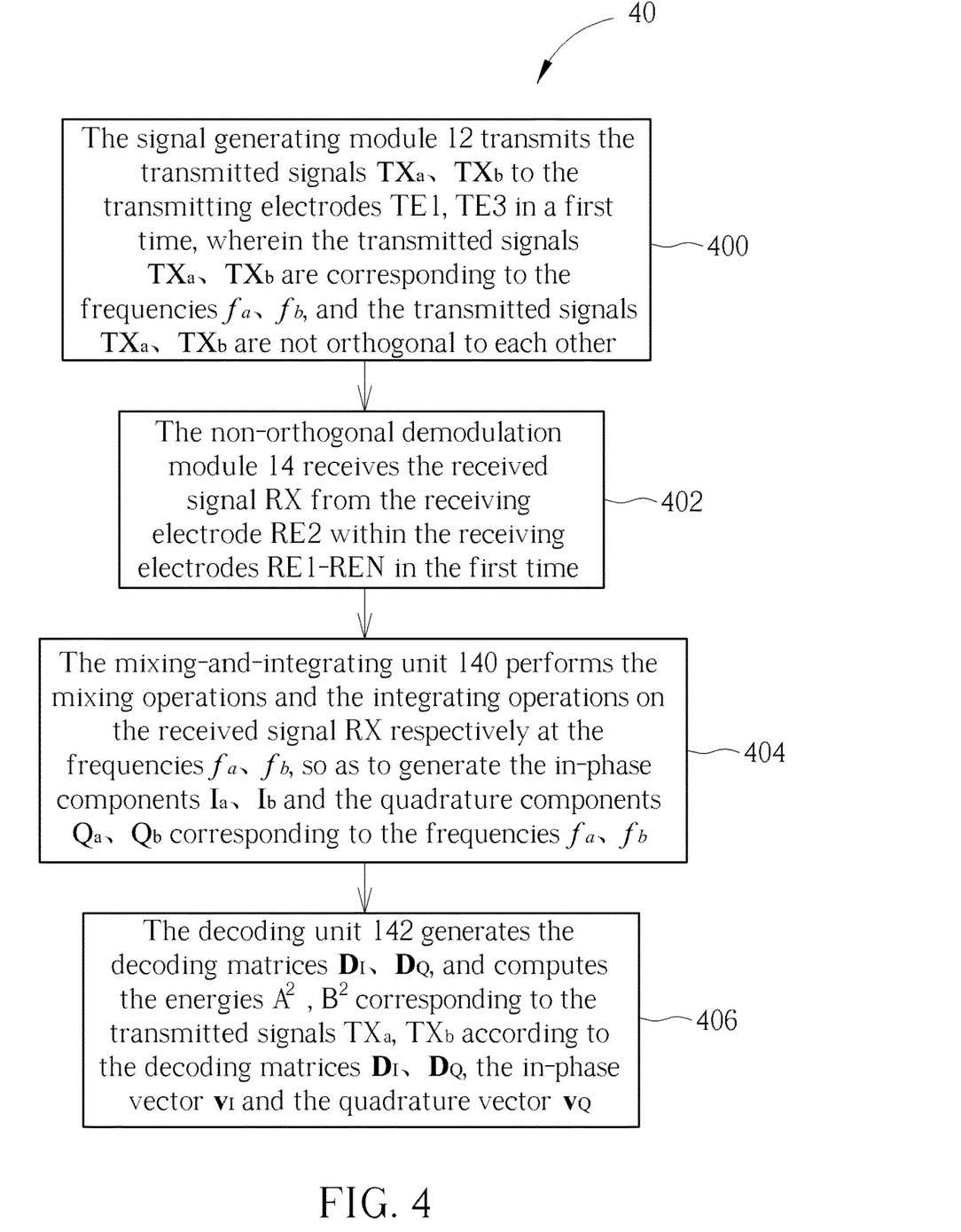
FIG. 4 is a schematic diagram of a non-orthogonal demodulation process according to an embodiment of the present application.

In a short summary, the signal generating module 12 of the touch system 10 may transmit the transmitted signals $TX_a$, $TX_b$ to the two transmitting electrodes TE1, TE3 at the same time, the non-orthogonal demodulation module 14 receives the received signal RX at the receiving electrode RE2, and the mixing-and-integrating unit 140 generates the in-phase components $I_a$, $I_b$ and the quadrature components $Q_a$, $Q_b$ corresponding to the frequencies $f_a$, $f_b$. The decoding unit 142, by executing the decoding process 30, obtains the matrices $P_I$, $P_Q$, computes the decoding matrices $D_I$, $D_Q$ as the inverse matrices of the matrices $P_I$, $P_Q$, respectively, and computes the energies $A^2$, $B^2$ corresponding to the transmitted signals $TX_a$, $TX_b$ according to the decoding matrices $D_I$, $D_Q$. Operations of the touch system 10 may be summarized into a non-orthogonal demodulation process. Please refer to FIG. 4. FIG. 4 is a schematic diagram of a non-orthogonal demodulation process 40 according to an embodiment of the present application. The non-orthogonal demodulation process 40 is executed by the touch system 10, which comprises the following steps:

Step 400: The signal generating module 12 transmits the transmitted signals $TX_a$, $TX_b$ to the transmitting electrodes TE1, TE3 in a first time, wherein the transmitted signals $TX_a$, $TX_b$ are corresponding to the frequencies $f_a$, $f_b$, and the transmitted signals $TX_a$, $TX_b$ are not orthogonal to each other.

Step 402: The non-orthogonal demodulation module 14 receives the received signal RX from the receiving electrode RE2 within the receiving electrodes RE1-REN in the first time.

Step 404: The mixing-and-integrating unit 140 performs the mixing operations and the integrating operations on the received signal RX respectively at the frequencies $f_a$, $f_b$, so as to generate the in-phase components $I_a$, $I_b$ and the quadrature components $Q_a$, $Q_b$ corresponding to the frequencies $f_a$, $f_b$.

Step 406: The decoding unit 142 generates the decoding matrices $D_I$, $D_Q$, and computes the energies $A^2$, $B^2$ corresponding to the transmitted signals $TX_a$, $TX_b$ according to the decoding matrices $D_I$, $D_Q$, the in-phase vector $v_I$ and the quadrature vector $v_Q$.

Details of Step 406 are introduced in the decoding process 30, and other details of the non-orthogonal demodulation process 40 may be referred to the paragraphs stated in the above, which are not narrated herein for brevity.

Furthermore, in practice, there may be other channel effect between the signal generating module 12 and the non-orthogonal demodulation module 14. Thus, in an embodiment, the matrices $P_I$, $P_Q$ may be obtained by calibration, which may further fit into the practical situation. That is, the touch system 10 may perform a calibration process, before the non-orthogonal demodulation process 40 is executed, to obtain the matrices $P_I$, $P_Q$, and then execute the non-orthogonal demodulation process 40 based on the matrices $P_I$, $P_Q$ derived from the calibration process, so as to obtain the energies $A^2$, $B^2$ corresponding to the transmitted signals $TX_a$, $TX_b$.

Figure 5:
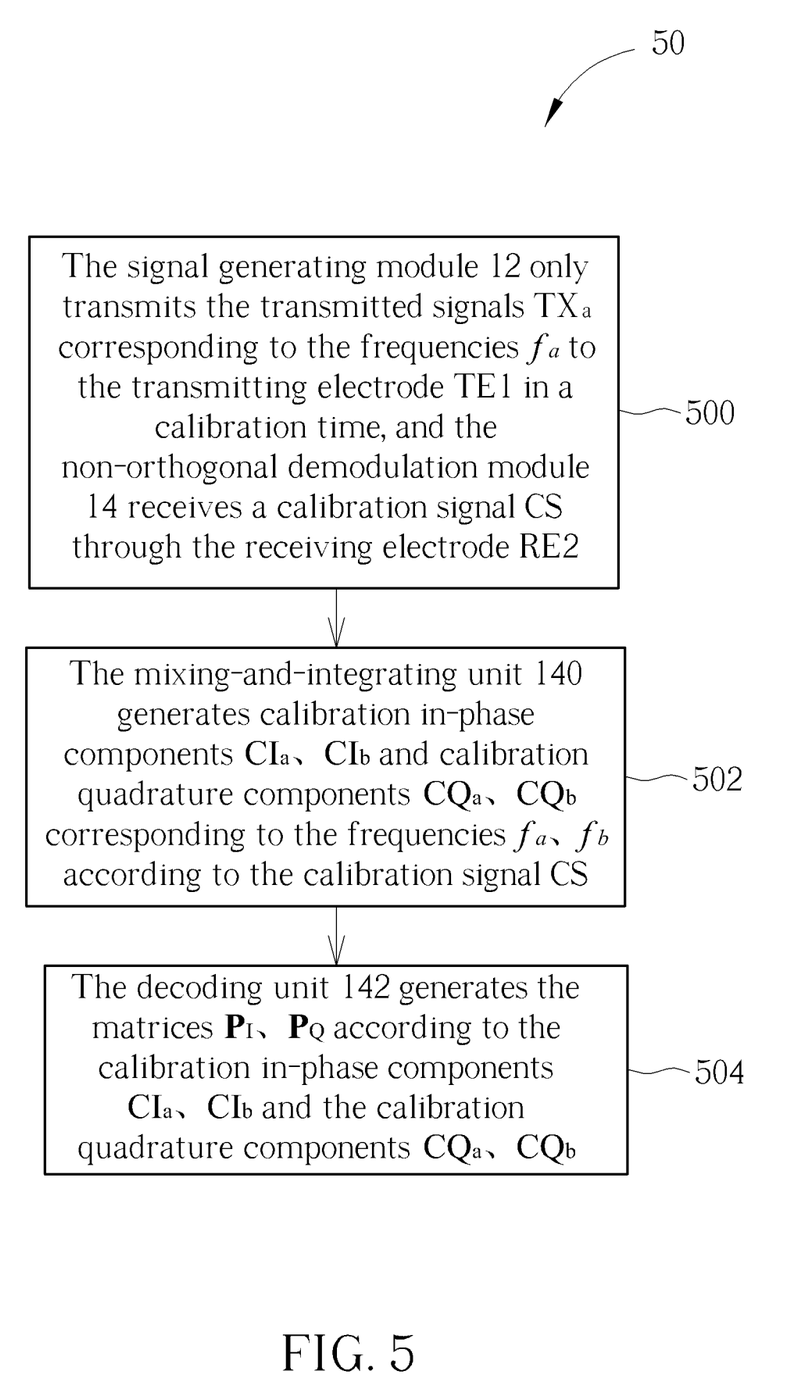
FIG. 5 is a schematic diagram of a calibration process according to an embodiment of the present application.

Specifically, please refer to FIG. 5. FIG. 5 is a schematic diagram of a calibration process 50 according to an embodiment of the present application. The calibration process 50 is executed by the touch system 10, which comprises the following steps:

Step 500: The signal generating module 12 only transmits the transmitted signals $TX_a$ corresponding to the frequencies $f_a$ to the transmitting electrode TE1 in a calibration time, and the non-orthogonal demodulation module 14 receives a calibration signal CS through the receiving electrode RE2.

Step 502: The mixing-and-integrating unit 140 generates calibration in-phase components $CI_a$, $CI_b$ and calibration quadrature components $CQ_a$, $CQ_b$ corresponding to the frequencies $f_a$, $f_b$ according to the calibration signal CS.

Step 504: The decoding unit 142 generates the matrices $P_I$, $P_Q$ according to the calibration in-phase components $CI_a$, $CI_b$ and the calibration quadrature components $CQ_a$, $CQ_b$.

In Step 500, the signal generating module 12 only transmits the transmitted signal $TX_a$ corresponding to the frequency $f_a$ to the transmitting electrode TE1 (where the transmitted signal $TX_a$ may be expressed as $TX_a = \sin 2\pi f_a t$) in the calibration time, where the calibration time is before the first time. The calibration signal CS received by the non-orthogonal demodulation module 14 through the receiving electrode RE2 in the calibration time may be expressed as $CS = A \sin(2\pi f_a t + \theta_a)$. In addition, the frequency $f_a$ may be chosen as a multiple to the reciprocal of the time interval T, i.e., $f_a = K/T$, which means that the frequency $f_a$ times the time interval T would be an integer.

In Step 502, according to the calibration signal CS, the mixing-and-integrating unit 140 may generate the calibration in-phase components $CI_a$, $CI_b$ and the calibration quadrature components $CQ_a$, $CQ_b$ corresponding to the frequencies $f_a$, $f_b$ as eq. 10.1-10.4. Notably, since the window function g(t) has the time interval T, the window spectrum G(f) has zero crossing point at the frequency f which is equal to a multiple of the reciprocal of the time interval T, i.e., $G(f)|_{f=K/T}=0$. In other words, when the frequency $f_a$ is a multiple of the reciprocal of the time interval T, the double frequency spectrum value $G(2f_a)$ is equal to 0.

$$CI_a = \left(\frac{AT}{2}\right)\cos\theta_a \qquad (\text{eq. 10.1})$$

$$CI_b = \left(\frac{-A}{2}G(f_{a+b}) + \frac{A}{2}G(f_{a-b})\right)\cos\theta_a \qquad (\text{eq. 10.2})$$

$$CQ_a = \left(\frac{AT}{2}\right)\sin\theta_a \qquad (\text{eq. 10.3})$$

$$CQ_b = \left(\frac{A}{2}G(f_{a+b}) + \frac{A}{2}G(f_{a-b})\right)\sin\theta_a \qquad (\text{eq. 10.4})$$

Therefore, in Step 504, the decoding unit 142 may obtain the matrices $P_I$, $P_Q$ as eq. 11.1 and eq. 11.2.

$$P_I = \begin{bmatrix} 1 & CI_b/CI_a \\ CI_b/CI_a & 1 \end{bmatrix} \qquad (\text{eq. 11.1})$$

$$P_Q = \begin{bmatrix} 1 & CQ_b/CQ_a \\ CQ_b/CQ_a & 1 \end{bmatrix} \qquad (\text{eq. 11.2})$$

In other words, by the calibration process 50, the touch system 10 may only transmit the transmitted signal $TX_a=\sin 2\pi f_a t$ to the transmitting electrode TE1, obtain the calibration in-phase components $CI_a$, $CI_b$ and the calibration quadrature components $CQ_a$, $CQ_b$ in the calibration time, and accordingly obtain $P_I$, $P_Q$ by eq. 11.1 and 11.2. Therefore, the touch system 10 may utilize the matrices $P_I$, $P_Q$ (as eq. 11.1, 11.2) derived from the calibration process 50 to execute the non-orthogonal demodulation process 40 (or the decoding process 30), so as to obtain the energies $A^2$, $B^2$ corresponding to the transmitted signals $TX_a$, $TX_b$.

Notably, the embodiments stated in the above are utilized for illustrating the concept of the present application. Those skilled in the art may make modifications and alterations accordingly, and not limited herein. For example, the embodiments in the above transmit two single-tone transmitted signals $TX_a$, $TX_b$ to two transmitting electrodes at one time, which is not limited thereto. The signal generating module 12 may transmit the plurality of transmitted signals to the plurality of transmitting electrodes at one (the same) time. For example, the signal generating module 12 may transmit $TX_a$, $TX_b$, $TX_c$, $TX_d$ to four transmitting electrodes at one (the same) time. The received signal RX may be expressed as $RX=A\sin(2\pi f_a t+\theta_a)+B\sin(2\pi f_b t+\theta_b)+C\sin(2\pi f_c t+\theta_c)+D\sin(2\pi f_d t+\theta_d)$. $\theta_a$, $\theta_b$, $\theta_a$, $\theta_b$ corresponding to the transmitted signals $TX_a$, $TX_b$, $TX_c$, $TX_d$ perceived at the receiving electrode, A, B, C, D are the amplitudes corresponding to the transmitted signals $TX_a$, $TX_b$, $TX_c$, $TX_d$ perceived at the receiving electrode, and $A^2$, $B^2$, $C^2$, $D^2$ are the energies corresponding to the transmitted signals $TX_a$, $TX_b$, $TX_c$, $TX_d$ at the receiving electrodes. The in-phase components $T_a$, $I_b$, $I_c$, $I_d$ and the quadrature components $Q_a$, $Q_b$, $Q_c$, $Q_d$ corresponding to the frequencies $f_a$, $f_b$, $f_c$, $f_d$ may be expressed as eq. 12.1-12.8, where the double frequency spectrum values and the sum spectrum values are ignored. The frequency difference $f_x$-y represents a difference between the frequencies $f_x$, $f_y$, which may be expressed as $f_{x-y}=f_x-f_y$. The in-phase vector $v_I$ and the quadrature vector $v_Q$ may be expressed in matrix form as eq. 13.1-13.2. The matrices $P_I$, $P_Q$ may be expressed as eq. 14. Notably, the off-diagonal entries of the matrices $P_I$, $P_Q$ are related to the difference spectrum values $G(f_{a-b})$, $G(f_{a-c})$, $G(f_{a-d})$, $G(f_{b-c})$, $G(f_{b-d})$, $G(f_{c-d})$. That is, the off-diagonal entries of the matrix P are related to the frequency difference $f_{a-b}$, $f_{a-c}$, $f_{a-d}$, $f_{b-c}$, $f_{b-d}$, $f_{c-d}$. That is also within the scope of the present application.

$$I_a = \frac{AT}{2}\cos\theta_a + \frac{B}{2}G(f_{a-b})\cos\theta_b + \qquad (\text{eq. 12.1})$$
$$\frac{C}{2}G(f_{a-c})\cos\theta_c + \frac{D}{2}G(f_{a-d})\cos\theta_d$$

$$I_b = \frac{A}{2}G(f_{a-b})\cos\theta_a + \frac{BT}{2}\cos\theta_b + \qquad (\text{eq. 12.2})$$
$$\frac{C}{2}G(f_{b-c})\cos\theta_c + \frac{D}{2}G(f_{b-d})\cos\theta_d$$

$$I_c = \frac{A}{2}G(f_{a-c})\cos\theta_a + \qquad (\text{eq. 12.3})$$
$$\frac{B}{2}G(f_{b-c})\cos\theta_b + \frac{CT}{2}\cos\theta_c + \frac{D}{2}G(f_{c-d})\cos\theta_d$$

$$I_d = \frac{A}{2}G(f_{a-d})\cos\theta_a + \qquad (\text{eq. 12.4})$$
$$\frac{B}{2}G(f_{b-d})\cos\theta_b + \frac{C}{2}G(f_{c-d})\cos\theta_c + \frac{DT}{2}\cos\theta_d$$

$$Q_a = \frac{AT}{2}\sin\theta_a + \frac{B}{2}G(f_{a-b})\sin\theta_b + \qquad (\text{eq. 12.5})$$
$$\frac{C}{2}G(f_{a-c})\sin\theta_c + \frac{D}{2}G(f_{a-d})\sin\theta_d$$

$$Q_b = \frac{A}{2}G(f_{a-b})\sin\theta_a + \frac{BT}{2}\sin\theta_b + \qquad (\text{eq. 12.6})$$
$$\frac{C}{2}G(f_{b-c})\sin\theta_c + \frac{D}{2}G(f_{b-d})\sin\theta_d$$

$$Q_c = \frac{A}{2}G(f_{a-c})\sin\theta_a + \qquad (\text{eq. 12.7})$$
$$\frac{B}{2}G(f_{b-c})\sin\theta_b + \frac{CT}{2}\sin\theta_c + \frac{D}{2}G(f_{c-d})\sin\theta_d$$

$$Q_d = \frac{A}{2}G(f_{a-d})\sin\theta_a + \qquad (\text{eq. 12.8})$$
$$\frac{B}{2}G(f_{b-d})\sin\theta_b + \frac{C}{2}G(f_{c-d})\sin\theta_c + \frac{DT}{2}\sin\theta_d$$

$$v_I = \begin{bmatrix} I_a \\ I_b \\ I_c \\ I_d \end{bmatrix} = \begin{bmatrix} T & G(f_{a-b}) & G(f_{a-c}) & G(f_{a-d}) \\ G(f_{a-b}) & T & G(f_{b-c}) & G(f_{b-d}) \\ G(f_{a-c}) & G(f_{b-c}) & T & G(f_{c-d}) \\ G(f_{a-d}) & G(f_{b-d}) & G(f_{c-d}) & T \end{bmatrix} \qquad (\text{eq. 13.1})$$

$$\begin{bmatrix} (A/2)\cos\theta_a \\ (B/2)\cos\theta_b \\ (C/2)\cos\theta_c \\ (D/2)\cos\theta_d \end{bmatrix} = P_I r_I$$

$$v_Q = \begin{bmatrix} Q_a \\ Q_b \\ Q_c \\ Q_d \end{bmatrix} = \begin{bmatrix} T & G(f_{a-b}) & G(f_{a-c}) & G(f_{a-d}) \\ G(f_{a-b}) & T & G(f_{b-c}) & G(f_{b-d}) \\ G(f_{a-c}) & G(f_{b-c}) & T & G(f_{c-d}) \\ G(f_{a-d}) & G(f_{b-d}) & G(f_{c-d}) & T \end{bmatrix} \qquad (\text{eq. 13.2})$$

$$\begin{bmatrix} (A/2)\sin\theta_a \\ (B/2)\sin\theta_b \\ (C/2)\sin\theta_c \\ (D/2)\sin\theta_d \end{bmatrix} = P_Q r_Q$$

$$P_I = P_Q = \begin{bmatrix} T & G(f_{a-b}) & G(f_{a-c}) & G(f_{a-d}) \\ G(f_{a-b}) & T & G(f_{b-c}) & G(f_{b-d}) \\ G(f_{a-c}) & G(f_{b-c}) & T & G(f_{c-d}) \\ G(f_{a-d}) & G(f_{b-d}) & G(f_{c-d}) & T \end{bmatrix} = P \quad \text{(eq. 14)}$$

In summary, the present application utilizes the decoding matrices to perform demodulation on the non-orthogonal transmitted signals, to compute the energies corresponding to the plurality of transmitted signals and to determine the coordinate of the touch event. Compared to the prior art, the present application has advantages of having smaller signal band.

The foregoing is only embodiments of the present application, which is not intended to limit the present application. Any modification following the spirit and principle of the present application, equivalent substitutions, improvements should be included within the scope of the present application.

What is claimed is:

1. A non-orthogonal demodulation module, configured to perform demodulation on a received signal, wherein the received signal is related to a summation of a plurality of transmitted signals, and the plurality of transmitted signals are not orthogonal to each other, characterized by, the non-orthogonal demodulation module comprising:
   a mixing-and-integrating unit, configured to perform mixing operations and integrating operations on the received signal respectively at a plurality of frequencies, to generate a plurality of in-phase components and a plurality of quadrature components corresponding to the plurality of frequencies, wherein each of the plurality of transmitted signals has a frequency and a phase, and the plurality of transmitted signals are respectively corresponding to the plurality of frequencies and the plurality of frequencies are different and not zero; and
   a decoding unit, configured to generate at least a decoding matrix, and compute a plurality of energies corresponding to the plurality of transmitted signals according to the at least a decoding matrix, the plurality of in-phase components and the plurality of quadrature components.

2. The non-orthogonal demodulation module of claim 1, characterized in that, the decoding unit is configured to perform the following steps:
   arranging the plurality of in-phase components as an in-phase vector, and arranging the plurality of quadrature components as a quadrature vector;
   obtaining at least a matrix, wherein the at least a matrix comprises a plurality of off-diagonal entries, the plurality of off-diagonal entries is related to at least a frequency difference, and the at least a frequency difference is a frequency difference between two frequencies within the plurality of frequencies;
   computing the at least a decoding matrix, wherein the at least a decoding matrix is related to an inverse matrix of the at least a matrix;
   obtaining an in-phase result and a quadrature result according to the at least a decoding matrix, the in-phase vector and the quadrature vector; and
   computing the plurality of energies corresponding to the plurality of transmitted signals according to the in-phase result and the quadrature result.

3. The non-orthogonal demodulation module of claim 2, characterized in that, the plurality of off-diagonal entries is related to the at least a frequency difference and at least a frequency sum, and the at least a frequency sum is a frequency sum of two frequencies within the plurality of frequencies.

4. The non-orthogonal demodulation module of claim 2, characterized in that, the mixing-and-integrating unit applies a window function on the received signal, the window function corresponds to a window spectrum, the plurality of off-diagonal entries is related to at least a difference spectrum value, and the at least a difference spectrum value is a spectrum value of the window spectrum corresponding to the at least a frequency difference.

5. The non-orthogonal demodulation module of claim 4, characterized in that, the plurality of off-diagonal entries is related to the at least a difference spectrum value and at least a sum spectrum value, the at least a sum spectrum value is a spectrum value of the window spectrum corresponding to at least a frequency sum, and the at least a frequency sum is a frequency sum of two frequencies within the plurality of frequencies.

6. A touch system, characterized by, comprising:
   a plurality of transmitting electrodes;
   a plurality of receiving electrodes;
   a signal generating module, coupled to the plurality of transmitting electrodes, wherein the signal generating module transmits the plurality of transmitted signals respectively to the plurality of transmitting electrodes in a first time, each of the plurality of transmitted signals has a frequency and a phase, and the plurality of transmitted signals are corresponding to a plurality of frequencies and the plurality of frequencies are different and not zero, and the plurality of transmitted signals are not orthogonal to each other; and
   a non-orthogonal demodulation module, coupled to the plurality of transmitting electrodes, wherein the non-orthogonal demodulation module receives a received signal on a first receiving electrode within the plurality of receiving electrodes in the first time;
   the non-orthogonal demodulation module is configured to perform demodulation on the received signal, wherein the received signal is related to a summation of a plurality of transmitted signals, and comprises:
      a mixing-and-integrating unit, configured to perform mixing operations and integrating operations on the received signal respectively at the plurality of frequencies, to generate a plurality of in-phase components and a plurality of quadrature components corresponding to the plurality of frequencies; and
      a decoding unit, configured to generate at least a decoding matrix, and compute a plurality of energies corresponding to the plurality of transmitted signals according to the at least a decoding matrix, the plurality of in-phase components and the plurality of quadrature components.

7. The touch system of claim 6, characterized in that, the signal generating module transmits a first transmitted signal to a first transmitting electrode within the plurality of transmitting electrodes in a calibration time, the non-orthogonal demodulation module receives a calibration signal through the first receiving electrode, the mixing-and-integrating unit generates a plurality of calibration in-phase components and a plurality of calibration quadrature components corresponding to the plurality of frequencies according to the calibration signal, the decoding unit generates the at least a matrix according to the plurality of calibration in-phase components or the plurality of calibration quadrature components, and the first transmitted signal is corresponding to a first frequency within the plurality of frequencies.

8. The touch system of claim 7, characterized in that, an off-diagonal entry within the plurality of off-diagonal entries is a ratio of a first calibration in-phase component and a second calibration in-phase component within the plurality of calibration in-phase components, and the first calibration in-phase component is corresponding to the first frequency.

9. The touch system of claim 7, characterized in that, an off-diagonal entry within the plurality of off-diagonal entries is a ratio of a first calibration quadrature component and a second calibration quadrature component within the plurality of calibration quadrature components, and the first calibration quadrature component is corresponding to the first frequency.

10. The touch system of claim 7, characterized in that, the first frequency times a time interval is an integer, and the time interval is a window function interval of the window function or an integration interval of the integrating operation.

11. A non-orthogonal demodulation method, applied in a touch system, wherein the touch system comprises a plurality of transmitting electrodes and a plurality of receiving electrodes, characterized by, the non-orthogonal demodulation method comprising:
transmitting the plurality of transmitted signals respectively to the plurality of transmitting electrodes in a first time, wherein each of the plurality of transmitted signals has a frequency and a phase, and the plurality of transmitted signals are corresponding to a plurality of frequencies and the plurality of frequencies are different and not zero, and the plurality of transmitted signals are not orthogonal to each other;
receiving a received signal from a first receiving electrode within the plurality of receiving electrodes in the first time;
performing mixing operations and integrating operations on the received signal respectively at the plurality of frequencies, to generate a plurality of in-phase components and a plurality of quadrature components corresponding to the plurality of frequencies; and
generating at least a decoding matrix, and computing a plurality of energies corresponding to the plurality of transmitted signals according to the at least a decoding matrix, the plurality of in-phase components and the plurality of quadrature components.

12. The non-orthogonal demodulation method of claim 11, characterized in that, the step of generating the at least a decoding matrix and computing the plurality of energies corresponding to the plurality of transmitted signals according to the at least a decoding matrix, the plurality of in-phase components and the plurality of quadrature components comprises:
arranging the plurality of in-phase components as an in-phase vector, and arranging the plurality of quadrature components as a quadrature vector;
obtaining at least a matrix, wherein the at least a matrix comprises a plurality of off-diagonal entries, the plurality of off-diagonal entries is related to at least a frequency difference, and the at least a frequency difference is a frequency difference between two frequencies within the plurality of frequencies;
computing the at least a decoding matrix, wherein the at least a decoding matrix is proportional to in inverse matrix of the at least a matrix;
obtaining an in-phase result and a quadrature result according to the at least a decoding matrix, the in-phase vector and the quadrature vector; and
computing the plurality of energies corresponding to the plurality of transmitted signals according to the in-phase result and the quadrature result.

13. The non-orthogonal demodulation method of claim 12, characterized in that, the plurality of off-diagonal entries is related to the at least a frequency difference and at least a frequency sum, and the at least a frequency sum is a frequency sum of two frequencies within the plurality of frequencies.

14. The non-orthogonal demodulation method of claim 12, characterized in that, the plurality of off-diagonal entries is related to at least a difference spectrum value, and the at least a difference spectrum value is a spectrum value of a window spectrum corresponding to the at least a frequency difference.

15. The non-orthogonal demodulation method of claim 14, characterized in that, the plurality of off-diagonal entries is related to the at least a difference spectrum value and at least a sum spectrum value, the at least a sum spectrum value is a spectrum value of the window spectrum corresponding to at least a frequency sum, and the at least a frequency sum is a frequency sum of two frequencies within the plurality of frequencies.

16. The non-orthogonal demodulation method of claim 12, characterized by, further comprising:
in a calibration time, transmitting a first transmitted signal to a first transmitting electrode within the plurality of transmitting electrodes, wherein the first transmitted signal is corresponding to a first frequency within the plurality of frequencies;
receiving a calibration signal from the first receiving electrode;
generating a plurality of calibration in-phase components and a plurality of calibration quadrature components corresponding to the plurality of frequencies according to the calibration signal; and
generating the at least a matrix according to the plurality of calibration in-phase components or the plurality of calibration quadrature components.

17. The non-orthogonal demodulation method of claim 16, characterized by, further comprising:
obtaining an off-diagonal entry within the plurality of off-diagonal entries as a ratio of a first calibration in-phase component and a second calibration in-phase component within the plurality of calibration in-phase components, wherein the first calibration in-phase component is corresponding to the first frequency.

18. The non-orthogonal demodulation method of claim 16, characterized by, further comprising:
obtaining an off-diagonal entry within the plurality of off-diagonal entries as a ratio of a first calibration quadrature component and a second calibration quadrature component within the plurality of calibration quadrature components, wherein the first calibration quadrature component is corresponding to the first frequency.

* * * * *